(12) United States Patent
Ball et al.

(10) Patent No.: US 6,426,550 B2
(45) Date of Patent: Jul. 30, 2002

(54) INTERLEAVED SIGNAL TRACE ROUTING

(75) Inventors: Zane A. Ball, Portland, OR (US); Aviram Gutman, Haifa (IL); Lawrence T. Clark, Phx, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/805,862

(22) Filed: Mar. 14, 2001

Related U.S. Application Data

(62) Division of application No. 09/096,276, filed on Jun. 11, 1998, now Pat. No. 6,246,112.

(51) Int. Cl.$^7$ ............................................. H01L 23/12
(52) U.S. Cl. ......................................... 257/700; 257/690
(58) Field of Search ................................. 257/690, 698, 257/691, 700, 701

(56) References Cited

U.S. PATENT DOCUMENTS 5,886,406 A    3/1999    Bhansali
6,323,116 B1 * 11/2001    Lamson ...................... 438/611

* cited by examiner

*Primary Examiner*—Roy Potter
(74) *Attorney, Agent, or Firm*—Blakely, Sokoloff, Taylor & Zafman LLP

(57) ABSTRACT

A multi-layer electronic device package includes first and second outer layers and at least one signal layer disposed between the outer layers. The signal layer includes signal traces and ground traces interleaved with the signal traces. A method of routing signal traces in an electronic device package includes the acts of disposing a plurality of signal traces in at least one substrate layer, and interleaving a plurality of ground traces with the signal traces.

16 Claims, 3 Drawing Sheets

INTERLEAVED SIGNAL TRACE ROUTING

CROSS-REFERENCE TO RELATED APPLICATIONS

This application is a divisional of application Ser. No.09/096,276, now U.S. Pat. No. 6,246,112 filed Jun. 11, 1998, and claims priority from that filing date.

BACKGROUND OF THE INVENTION

1. Field of the Invention

The invention relates generally to multi-layer electronic device packages, and more particularly, to routing signal traces in a multi-layer package.

2. Description of Related Art

Multi-layer electronic device packages, such as multi-layer printed circuit boards ("PCBs") and multi-chip modules ("MCMs"), are well known in the art. Multi-layer packages include a plurality of substrate layers, with at least one of the outer substrate layers of the multi-layer package typically adapted to have electronic components mounted thereon. One or more of the substrate layers has conductive traces incorporated therewith that act as wires to interconnect the components mounted on the package. Other layers may provide power and ground connections to the components.

Incorporating conductive traces in multiple substrate layers allows circuit designers to lay out complex circuit designs using numerous interconnections between components, while minimizing the required surface area of the package. Electrical connections between the various substrate layers of the package, and between layers of the package and components mounted on the package, is achieved using "vias." Basically, a via is a hole extending through substrate layers that is filled with conductive material to form an electrical connection.

Multi-layer packages are used extensively in computer systems and other semiconductor applications. The conductive traces of the multi-layer package may be used to route signals between components coupled to the package. Routing a high number of signals in a small area—especially high-speed signals—creates problems with parasitic noise generated from the signals routed through adjacent traces. This is especially problematic when multiple signal layers are employed for routing signals. This parasitic noise, sometimes also called "cross-talk," may result in spurious logic errors.

The present invention addresses some of the above mentioned and other problems of the prior art.

SUMMARY OF THE INVENTION

In one aspect of the invention, multi-layer electronic device package includes first and second outer layers and at least one signal layer disposed between the outer layers. The signal layer includes signal traces and ground traces interleaved with the signal traces.

In another aspect of the invention, a method of routing signal traces in an electronic device package includes the acts of disposing a plurality of signal traces in at least one substrate layer, and interleaving a plurality of ground traces with the signal traces.

In a further aspect of the invention, a semiconductor device includes a first semiconductor die, a second semiconductor die, and a multi-layer package, with the first die and the second die mounted on the multi-layer package. The multi-layer package defines at least one signal layer. Each signal layer includes signal traces and ground traces interleaved therewith, with the signal traces interconnecting the first die and the second die.

BRIEF DESCRIPTION OF THE DRAWINGS

Other objects and advantages of the invention will become apparent upon reading the following detailed description and upon reference to the drawings in which.

Figure 1:
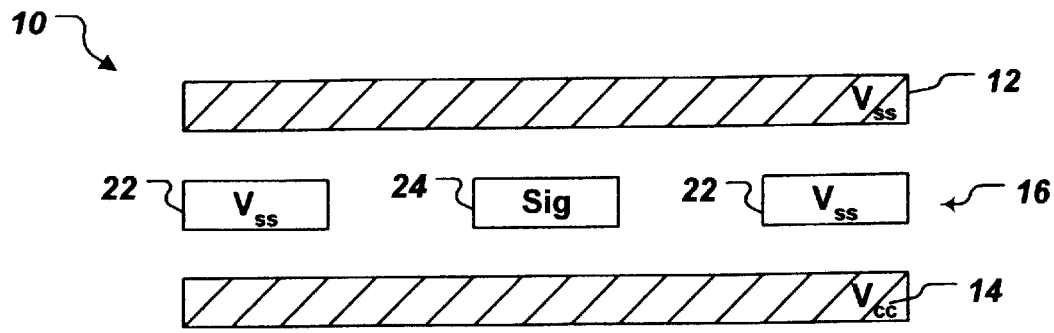
FIG. 1 is a conceptualized, cross-sectional view of a multi-layer package in accordance with an embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

FIG. 1 illustrates a conceptualized cross-section of a multi-layer electronic device package 10 in accordance with an embodiment of the present invention. The exemplary package 10 includes two outer layers 12, 14. In one embodiment, the outer layers comprise a ground ($V_{ss}$) layer 12 and a power ($V_{cc}$) layer 14. Other outer layer arrangements are possible, such as two outer ground layers in conjunction with an inner power layer. The package 10 further includes at least one internal signal layer 16 disposed between the outer layers 12, 14. Each layer 12, 14, 16 of the package comprises two portions, including an insulating portion and a conductive portion disposed on, or incorporated with, the insulating portion as discussed more fully below. In the present specification, a "substrate layer" refers to any of the layers of the multi-layer package, including both the insulating portion and the conductive portion incorporated therewith.

The substrate layers 12, 14, 16 of the package 10 may be fabricated out of any suitable substrate material, including standard PCB materials such as Fire Retardant-4 ("FR-4"), Bismaleimide Triazine ("BT"), ceramic, or an organic advanced printed circuit board ("APCB") substrate material as is known in the art. In typical PCB manufacture, conductive traces are formed on each layer, then the layers are stacked and bonded together. With an APCB material, the conductive traces may be built up upon the nonconducting substrate using thin film approaches. Thus, with an APCB substrate, the multiple layers are usually built-up by a sequential process.

The signal layers of known multi-layer packages typically define a plurality of conductive signal traces for routing signals between components coupled to the package. In the embodiment of the invention illustrated in FIG. 1, however, the signal layer 16 includes both ground ($V_{ss}$) traces 22 and signal traces 24. The traces 22, 24 are ranged such that the ground traces 22 shield adjacent signal traces 24 from each other. The ground traces 22 are "interleaved," or alternated with the signal traces 24 within the signal layer 16 to provide this shielding.

Figure 2:
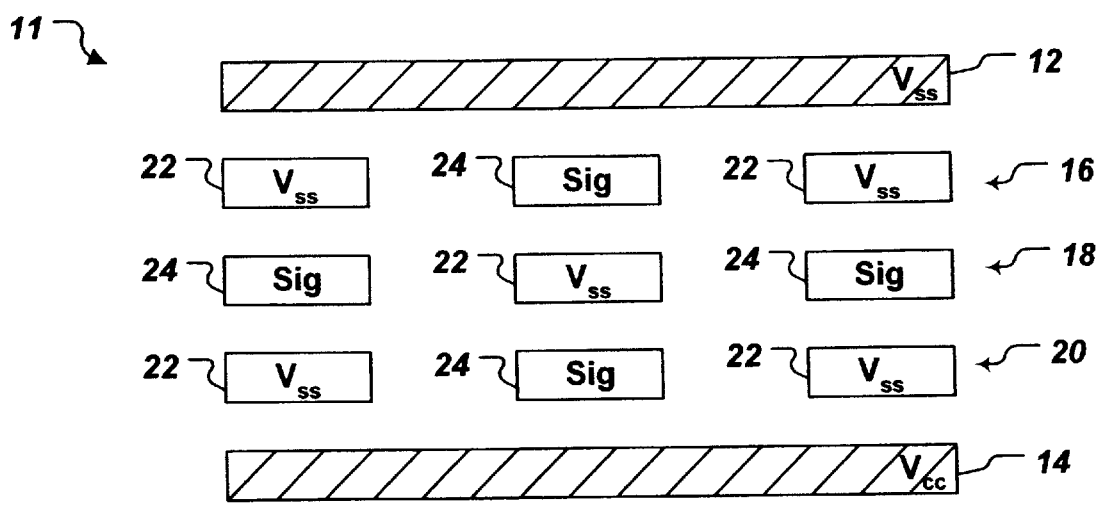
FIG. 2 is a conceptualized, cross-sectional view of a multi-layer package having three signal layers in accordance with an embodiment of the present invention.

FIG. 2 illustrates a multi-layer package 11 in accordance with an embodiment of the invention that includes three signal layers 16, 18, 20. As in the embodiment illustrated in FIG. 1, the ground traces 22 are interleaved with the signal traces 24 within each of the signal layers 16, 18, 20. Alternative embodiments may have some signal layers that have ground traces interleaved-with the signal traces to shield the signal traces, while other signal layers do not have ground traces shielding the signal traces.

The ground traces 22 may further be arranged such that, in addition to shielding adjacent signal traces 24 within a signal layer, ground traces 22 are interleaved with signal traces 24 between layers, thus reducing cross-talk from signal traces 24 in other signal layers. For example, as shown in FIG. 2, ground traces 22 in signal layer 18 are situated between aligned signal traces 24 in signal layers 16 and 20. Interleaving ground traces 22 with signal traces 24 between layers may eliminate the need for additional ground layers, increasing the potential signal density without requiring additional device layers and associated costs of adding a layer.

Figure 3:
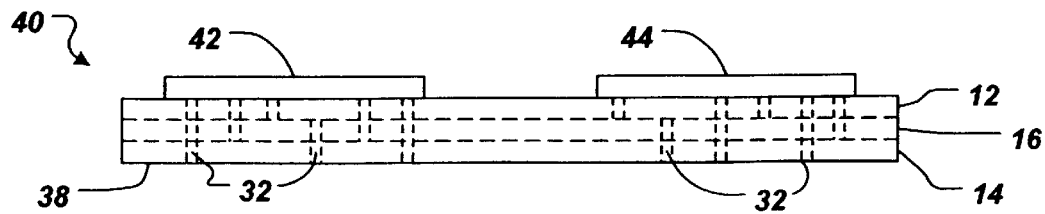
FIG. 3 is a side view of an MCM employing a multi-layer package in accordance with an embodiment of the present invention.

Multi-layer packages in accordance with the present invention are particularly suitable in applications requiring routing of several high-speed signals. For example, the signal traces 24 may be used to route a plurality of signals between two or more semiconductor devices mounted on the multi-layer package. FIG. 3 illustrates an exemplary multi-hip module ("MCM") 40 in accordance with an embodiment of the invention, in which two semiconductor dice 42, 44 are mounted directly on a multi-layer package 38 using any of several known methods, including wire bonding, tape automated bonding ("TAB"), controlled collapse chip connection ("C4"), etc. The package 38 includes a plurality of layers 12, 14, 16, including at least one signal layer 16 having signal traces and ground traces (not shown in FIG. 3) interleaved in the manner described in conjunction with FIG. 1 and FIG. 2. In embodiments employing multiple signal layers, the ground traces may be further interleaved with signal traces between layers.

A plurality-of vias 32 interconnect the substrate layers 12, 14, 16, and also couple the substrate layers 12, 14, 16 to the semiconductor dice 42, 44. The vias 32 further couple the layers 12, 14, 16 and the semiconductor dice 42, 44 to the bottom surface of the package 38, which in turn, may be coupled to another package such as a system motherboard or other PCB with surface-mount or through-hole techniques as are well known in the art.

Figure 4:
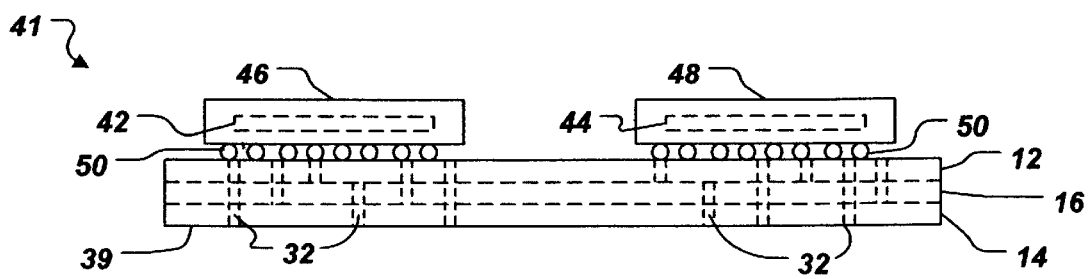
FIG. 4 is a side view of a PCB assembly employing a multi-layer package in accordance with an embodiment of the present invention.

FIG. 4 illustrates an exemplary PCB assembly 41, such as a computer system motherboard, in accordance with aspects of the present invention, wherein a multi-layer package 39 is embodied in a PCB. Two or more semiconductor dice 42, 44 are disposed in individual component packages 46, 48, which, for example, may comprise pin grid array ("PGA") packages, ball grid array ("BGA") packages, dual in-line packages ("DIP"), or other package types as are known in the art. In the particular embodiment illustrated in FIG. 5, the component packages 46, 48 comprise BGA packages that are mounted on the multi-layer package 39 via a plurality of solder balls 50.

The package 39 includes a plurality of layers 12, 14, 16, including at least one signal layer 16 having signal traces and ground traces (not shown in FIG. 4) interleaved in the manner described in conjunction with FIG. 1 and FIG. 2. In embodiments employing multiple signal layers, the ground traces may be further interleaved with signal traces between layers. A plurality of vias 32 interconnects the layers 12, 14, 16 of the package 10, and also connects the conductive portions of the layers 12, 14, 16 to the solder ball array 50 of the component packages 46, 48.

Figure 5:
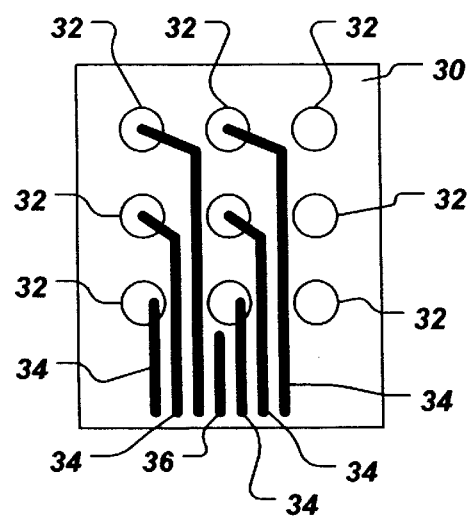
FIG. 5 illustrates a portion of a single layer of a multi-layer package in accordance with aspects of the present invention.

The number of traces routed per layer may be limited in various embodiments of the invention by, among other things, the size of the package, the pitch and width of the traces, and the diameter and horizontal pitch of the vias in various embodiments of the invention. FIG. 5 illustrates an example of a portion of a substrate layer 30 of a multi-layer package in accordance with aspects of the present invention. The layer 30 defines a plurality of vias 32 therethrough that interconnect the various layers of the multi-layer package. Vias 32 also provide interconnections between the components mounted on the package and the various layers of the package. For example, in applications in which the components are mounted on the package using C4, the vias terminate in a via land, sometimes referred to as a "bump," to which the component connects. A plurality of traces 34, comprising both signal and ground traces, are disposed on the layer 30 in an interleaved manner as disclosed above.

The relative size of the vias 32 and the traces 34, along with the required spacing between the vias 32 and the traces 34, influences the number of traces 34 that will fit between adjacent vias 32 and is implementation specific. In one embodiment, the trace pitch is about 74 $\mu$m, the signal and ground traces 34 are about 37 $\mu$m wide, the via pitch is about 318 $\mu$m and the opening diameter of the vias 32 is about 150 $\mu$m. Thus, two traces 34 may be routed between vias 32 in this embodiment. FIG. 3 also illustrates a trace 36 that, while meeting the minimum pitch requirements, is unroutable, or "trapped," due to the positioning of the vias 32. In a particular embodiment having trace and via pitch and sizes as described above, 250 signals were able to be routed in a 18,500 μm wide array.

The exemplary MCM 40 and PCB assembly 41 illustrated in FIG. 3 and FIG. 4 may comprise, for example, a processor device, such as the type around which a computer is mounted. Processors typically include various cache memories, including memory caches and disk caches. A memory cache typically is a portion of memory made of high-speed static random access memory ("SRAM") instead of the slower and cheaper dynamic random access memory ("DRAM") used for main memory. Memory caching is effective because most programs access the same data or instructions over and over. By keeping as much of this information as possible in SRAM, the computer avoids accessing the slower DRAM.

Some memory caches are built into the architecture of processors and are known as "internal" caches. Such internal caches are often called primary, or Level 1 ("L1") caches. The processor may access main memory and L1 caches via a system bus. Many computers also come with external cache memory, often called Level 2 ("L2") caches. The processor may access the L2 cache via a dedicated bus, sometimes referred to as a "backside bus." Like L1 caches, L2 caches are composed of SRAM, but they are typically much larger. The L2 cache improves system-level performance by improving the processor's memory read and write performance, as well as decreasing the system bus utilization. The large L2 cache results in less processor read requirements to main memory, thereby reducing the number of times the processor needs to access the system bus.

Figure 6:
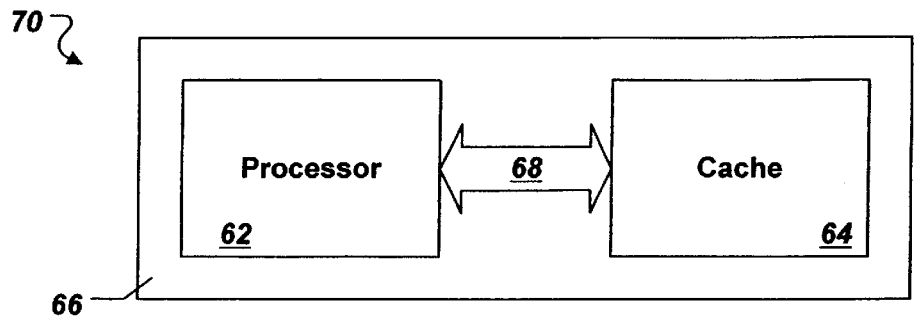
FIG. 6 is a block diagram illustrating a processor having an external cache made up of a single memory die, employing a multi-layer package in accordance with an embodiment of the present invention.
Figure 7:
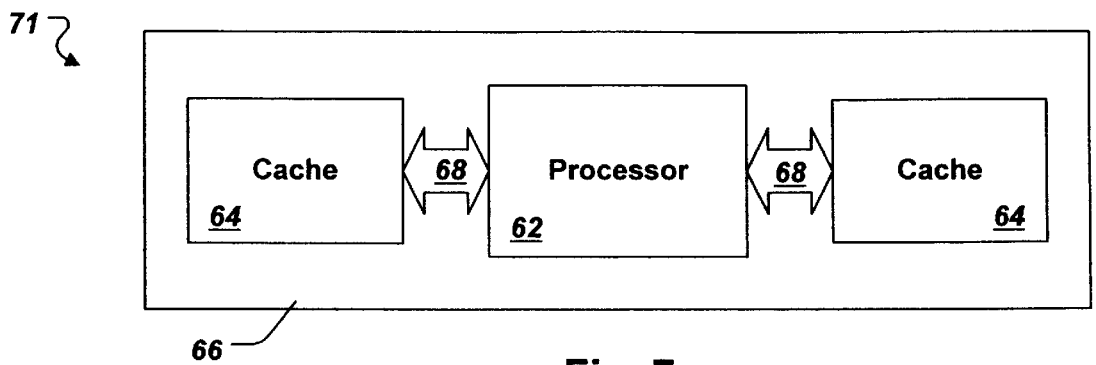
FIG. 7 is a block diagram illustrating a processor device having an external cache made up of two memory dice in a first configuration, employing a multi-layer package in accordance with an embodiment of the present invention.
Figure 8:
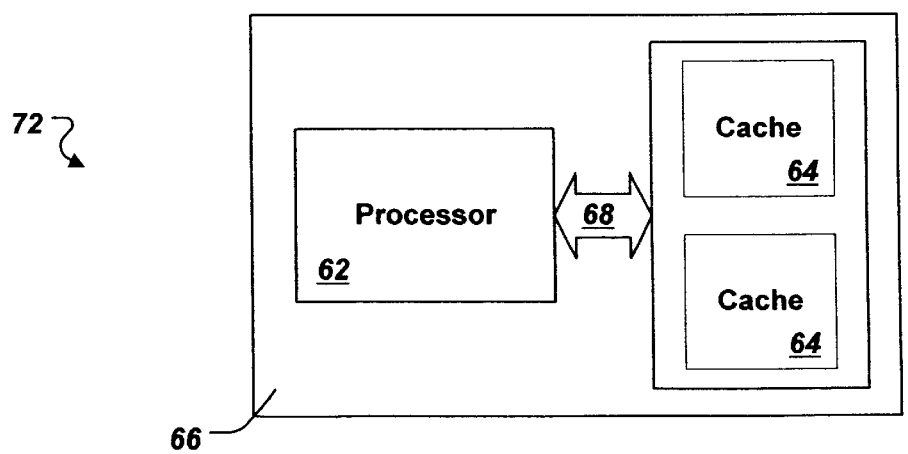
FIG. 8 is a block diagram illustrating a processor device having an external cache made up of two memory dice in a second configuration, employing a multi-layer package in accordance with an embodiment of the present invention.

In a particular embodiment in accordance with aspects of the present invention, a multi-layer package is used to implement a backside bus that interconnects a processor and an external cache. FIG. 6 illustrates such a processor device 70, including a processor semiconductor die 62 and at least one cache semiconductor die 64 coupled to a multi-layer package 66 having interleaved signal and ground traces as disclosed herein above. FIG. 7 shows another processor device 71 employing a processor semiconductor die 62 and two cache dice 64 situated on opposite sides of the processor die 62. FIG. 8 illustrates yet another processor device 72 having two cache dice 64 situated to one side of a processor die 62 in a generally L-shaped configuration. In each of the embodiments illustrated in FIG. 6, FIG. 7 and FIG. 8, the processor 62 may be any type of processor known to the art, and likewise, the cache 64 may be any suitable memory device known to the art.

The processor die 62 and the one or more memory dice 64 are interconnected by a backside bus 68 for routing signals therebetween. The backside bus 68 comprises a plurality of signal traces disposed within the signal layers of the multi-layer package 66 in the manner described in conjunction with FIG. 1 and FIG. 2. The processor die 62 and memory dice 64 may be directly coupled to the package 66, as illustrated in FIG. 3. Alternatively, the processor and memory dice 62, 64 may be disposed in individual component packages that are mounted on the package 66 in the manner described in conjunction with FIG. 4.

To increase system performance, it is desirable to increase the width (number of signal traces) of the backside bus, while increasing processor speed. In other words, providing more interconnections (conductive traces) between the processor 62 and cache 64 would allow more signals to be transferred in a given time period. However, problems such as cross-talk between signal traces has limited the width of existing backside buses. Prior to the present invention, routing signal traces in multiple signal layers has been largely unsatisfactory, as traces in adjacent layers typically may not be used simultaneously due to intense cross-talk between the traces. Interleaving ground traces 22 with signal traces 24 (referring to FIG. 1) reduces cross-talk, allowing simultaneous use of traces in adjacent layers, thus providing a greater density of usable signal traces 24 within a given package space. Moreover, providing both signal and ground traces within a layer may eliminate a ground layer in the package, providing additional signal layers without the added expense and complication of adding additional layers to the package.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is a set forth in the claims below.

What is claimed is:

1. A semiconductor device comprising:
   a first semiconductor die;
   a second semiconductor die; and
   a multi-layer package, the first die and the second die being mounted on the multi-layer package;
   the multi-layer package defining at least one signal layer, each signal layer including signal traces and ground traces interleaved therewith, the signal traces interconnecting the first die and the second die.

2. The semiconductor device of claim 1 wherein the first semiconductor die is disposed in a first component package that is mounted on the multi-layer package.

3. The semiconductor device of claim 2 wherein the second semiconductor die is disposed in a second component package that is mounted on the multi-layer package.

4. The semiconductor device of claim 1 wherein the at least one signal layer comprises three signal layers.

5. The semiconductor device of claim 1 wherein the first semiconductor die comprises a processor.

6. The semiconductor device of claim 1 wherein the second semiconductor die comprises at least one memory device.

7. The semiconductor device of claim 6 wherein the at least one memory device comprises two memory devices.

8. The semiconductor device of claim 7 wherein the memory devices are situated on opposite sides of the processor.

9. The semiconductor device of claim 7 wherein the memory devices are situated on one side of the processor.

10. The semiconductor device of claim 1 wherein the ground traces are interleaved with the signal traces within at least one of the signal layers.

11. The semiconductor device of claim 1 wherein the ground traces are interleaved with the signal traces between signal layers.

12. The semiconductor device of claim 1 further comprising a plurality of vias that couple the signal traces to the first semiconductor die and the second semiconductor die.

13. A multi-layer electronic device package comprising:
a plurality of signal traces; and
a plurality of ground traces interleaved with the plurality of signal traces.

14. The multi-layer electronic device package of claim 13 wherein the signal traces and the ground traces are incorporated in at least one substrate layer.

15. The multi-layer electronic device package of claim 14 wherein the ground traces are interleaved with the signal traces within at least one substrate layer.

16. The multi-layer electronic device package of claim 14 wherein the ground traces are interleaved with the signal traces between substrate layers.

* * * * *